United States Patent [19]

Izu et al.

[11] Patent Number: 4,677,738

[45] Date of Patent: * Jul. 7, 1987

[54] METHOD OF MAKING A PHOTOVOLTAIC PANEL

[75] Inventors: Masatsugu Izu, Birmingham; Vincent D. Cannella, Detroit; Stanford R. Ovshinsky, Bloomfield Hills, all of Mich.

[73] Assignee: Energy Conversion Devices, Inc., Troy, Mich.

[*] Notice: The portion of the term of this patent subsequent to Aug. 23, 2000 has been disclaimed.

[21] Appl. No.: 835,590

[22] Filed: Mar. 3, 1986

Related U.S. Application Data

[62] Division of Ser. No. 750,444, Jul. 1, 1985, abandoned, which is a division of Ser. No. 653,019, Sep. 21, 1984, abandoned, which is a division of Ser. No. 402,115, Jul. 26, 1982, abandoned, which is a division of Ser. No. 151,301, May 19, 1980, Pat. No. 4,400,409.

[51] Int. Cl.⁴ .............................................. H01L 31/18
[52] U.S. Cl. ........................................ 29/572; 427/39; 427/74; 427/86
[58] Field of Search ...................... 29/572; 427/39, 74, 427/86

[56] References Cited

U.S. PATENT DOCUMENTS

| | | | |
|---|---|---|---|
| 3,914,856 | 10/1975 | Fang | 29/572 |
| 4,313,254 | 2/1982 | Feldman et al. | 29/572 |
| 4,400,409 | 8/1983 | Izu et al. | 427/39 |

Primary Examiner—Aaron Weisstuch
Attorney, Agent, or Firm—Marvin S. Siskind; Richard M. Goldman

[57] ABSTRACT

A method of making a photovoltaic panel which includes the continuous deposition of silicon films onto a continuously moving substrate web.

1 Claim, 3 Drawing Figures

METHOD OF MAKING A PHOTOVOLTAIC PANEL

This is a division of application Ser. No. 750,444 filed July 1, 1985, now abandoned, which is a division of application Ser. No. 653,019 filed Sept. 21, 1984, now abandoned, which is a division of application Ser. No. 402,115 filed July 26, 1982, now abandoned, which is a division of application Ser. No. 151,301 filed May 19, 1980, now U.S. Pat. No. 4,400,409 issued Aug. 23, 1983.

BACKGROUND AND SUMMARY OF INVENTION

This invention relates to a method of making more efficiently p-doped silicon films with higher acceptor concentrations and devices made therefrom so that improved p-n and p-i-n devices can be now produced in a batch or continuous process involving the successive deposition and formation of all or partially amorphous p and n type silicon films. While the invention has utility in making diodes, switches, and amplifier devices like transistors, it has its most important application in the making of photoconductive devices like solar cells or other energy conversion devices.

When crystalline semiconductor technology reached a commercial state, it became the foundation of the present huge semiconductor devices manufacturing industry. This was due to the ability of scientists to grow substantially defect-free germanium and particularly silicon crystals, and then turn them into extrinsic materials with p-type and n-type conductivity regions therein. This was accomplished by diffusing into such crystalline material parts per million of donor (n) or acceptor (p) dopant materials introduced as substitutional impurities into the substantially pure crystalline materials, to increase their electrical conductivity and to control their being either of a p or n conduction type. The fabrication processes for making p-n junction and photoconductive crystals involve extremely complex, time consuming, and expensive procedures. Thus, these crystalline materials useful in solar cells and current control devices are produced under very carefully controlled conditions by growing individual single silicon or germanium crystals, and when p-n junctions are required, by doping such single crystals with extremely small and critical amounts of dopants.

These crystal growing processes produce such relatively small crystals that solar cells require the assembly of many single crystals to encompass the desired area of only a single solar cell panel. The amount of energy necessary to make a solar cell in this process, the limitation caused by the size limitations of the silicon crystal, and the necessity to cut up and assemble such a crystalline material have all resulted in an impassable economic barrier to the large scale use of crystalline semiconductor solar cells for energy conversion. Further, crystalline silicon has an indirect optical edge, which results in poor light absorption in the material. Because of the poor light absorption, crystalline solar cells have to be at least 50 microns thick to absorb the incident sunlight. Even if the crystalline material is replaced by polycrystalline silicon with cheaper production processes, the indirect optical edge is still maintained; hence the material thickness is not reduced. The polycrystalline material also involves the addition of grain boundaries and other problem defects. On the other hand, amorphous silicon has a direct optical edge and only one-micron-thick material is necessary to absorb the same amount of sunlight as crystalline silicon.

Accordingly, a considerable effort has been made to develop processes for readilly depositing amorphous semiconductor films, each of which can encompass relatively large areas, if desired, limited only by the size of the deposition equipment, and which could be readily doped to form p-type and n-type materials where p-n junction devices are to be made therefrom equivalent to those produced by their crystalline counterparts. For many years such work was substantially unproductive. Amorphous silicon or germanium (Group IV) films were found to have microvoids and dangling bonds and other defects which produce a high density of localized states in the energy gap thereof. The presence of a high density of localized states in the energy gap of amorphous silicon semiconductor films results in a low degree of photoconductivity and short diffusion lengths, making such films unsuitable for solar cell applications. Additionally, such film cannot be successfully doped or otherwise modified to shift the Fermi level close to the conduction or valence bands, making them unsuitable for making Schottky barrier or p-n junctions for solar cells and current control device applications.

In an attempt to minimize the aforementioned problems involved with amorphous silicon and germanium, W. E. Spear and P. G. Le Comber of Carnegie Laboratory of Physics, University of Dundee, in Dundee, Scotland, did some work on "Substitutional Doping of Amorphous Silicon", as reported in a paper published in *Solid State Communications*, Vol. 17, pp. 1193–1196 (1975), toward the end of reducing the localized states in the energy gap in the amorphous silicon or germanium to make the same approximate more closely intrinsic crystalline silicon or germanium and of substitutionally doping said amorphous materials with suitable classic dopants, as in doping crystalline materials, to make them extrinsic and of p or n conduction types. The reduction of the localized states was accomplished by glow discharge deposition of amorphous silicon films wherein a gas or silane ($SiH_4$) was passed through a reaction tube where the gas was decomposed by an r.f. glow discharge and deposited on a substrate at a substrate temperature of about 500°–600° K. (227° C–327° C.). The material so deposited on the substrate was an intrinsic amorphous material consisting of silicon and hydrogen. To produce a doped amorphous material, phosphine ($PH_3$) gas for n-type conduction or diborane ($B_2H_6$) gas for p-type conduction were premixed with the silane gas and passed through the glow discharge reaction tube under the same operating conditions. The gaseous concentration of the dopants used were between about $5 \times 0^{-6}$ and $10^{-2}$ parts per volume. The material so deposited included supposedly substitutional phosphorous or boron dopant and was shown to be extrinsic and of n or p conduction type. However, the doping efficiency for the same amount of added dopant material was much poorer than that of crystalline silicon. The electrical conductivity for highly doped n or p material was low, being about $10^{-2}$ or $10^{-3}$ $(\Omega cm)^{-1}$. In addition, the band gap was narrowed due to the addition of the dopant materials, especially in the case of p-doping using diborane. These results indicate that diborane did not efficiently dope the amorphous silicon but created localized states in the band gap.

As expressed above, amorphous silicon, and also germanium, is normally four-fold coordinated, and normally has microvoids and dangling bonds or other defective configurations, producing localized states in the energy gap. While it was not known by these researchers, it is now known by the work of others that the hydrogen in the silane combines at an optimum temperature with many of the dangling bonds of the silicon during the glow discharge deposition, to decrease substantially the density of the localized states in the energy gap, toward the end of making amorphous material approximate more nearly the corresponding crystalline material.

However, the incorporation of hydrogen not only has limitations based upon the fixed ratio of hydrogen to silicon in silane, but, most importantly, various Si:H bonding configurations introduce new antibonding states which can have deleterious consequences in these materials. Therefore, there are basic limitations in reducing the density of localized states in these materials which are particularly harmful in terms of effective p as well as n doping. The resulting unacceptable density of states of the silane-deposited materials leads to a narrow depletion width, which in turn limits the efficiencies of solar cells and other devices whose operation depends on the drift of free carriers. The method of making these materials by the use of only silicon and hydrogen also results in a high density of surface states which affects all the above parameters.

After the development of the glow discharge deposition of silicon from silane gas was carried out, work was done on the sputter depositing of amorphous silicon films in the atmosphere of a mixture of argon (required by the sputtering deposition process) and molecular hydrogen, to determine the results of such molecular hydrogen on the characteristics of the deposited amorphous silicon film. This research indicated that the hydrogen acted as an altering agent which bonded in such a way as to reduce the localized states in the energy gap. However, the degree to which the localized states of the energy gap were reduced in the sputter deposition process was much less than that achieved by the silane deposition process described above. The above described p and n dopant gases also were introduced in the sputtering process to produce p and n doped materials. These materials had a lower doping efficiency than the materials produced in the glow discharge process. Neither process produced efficient p-doped materials with sufficiently high acceptor concentrations for producing commercial p-n or p-i-n junction devices. The n-doping efficiency was below desirable acceptable commercial levels and the p-doping was particularly undesirable since it reduced the width of the band gap and increased the numbers of localized states in the band gap.

The prior art amorphous silicon, which has been altered by hydrogen from the silane gas in an attempt to make it more closely resemble crystalline silicon and which has been doped in a manner like that of doping crystalline silicon, has characteristics which in all important respects are inferior to those of doped crystalline silicon. Thus, inadequate doping efficiencies and conductivity were achieved especially in the p-type material, and the photoconductive and photovoltaic qualities of these silicon films left much to be desired.

A substantive breakthrough in forming amorphous silicon films with a very low density of states was achieved by the inventions disclosed in U.S. Pat. Nos. 4,217,374 and 4,226,898 issued 8/12/80 and 10/7/80, respectively, to Onshinsky, et al which produced amorphous films, particularly silicon amorphous films, having the relative favorable attributes of crystalline semiconductor materials. (The former patent discloses the deposition of improved amorphous silicon films using vapor deposition thereof and the latter patent discloses the deposition of improved amorphous silicon films by glow discharge of silicon-containing gases.) The improved amorphous intrinsic silicon films produced by the processes disclosed therein have reduced number of states in the band gap in the intrinsic material and provide for greatly increased n-doping efficiencies, high photoconductivity and increased mobility, long diffusion length of the carriers, and low dark intrinsic electrical conductivity as desired in photovoltaic cells. Thus, such amorphous semiconductor films can be useful in making more efficient devices, such as solar cells and current controlling devices including p-n junction devices, diodes, transistors and the like.

The invention which achieved these results incorporates into the amorphous films, preferably as they are being deposited, altering or compensating materials which are believed to form alloys with the amorphous semiconductor materials and modify the same so as to greatly reduce the localized states in the energy gap thereof to make the same equivalent in many respects to intrinsic crystalline silicon. In the process of forming silicon films disclosed in said U.S. Pat. No. 4,226,898 a compound including silicon as an element thereof is decomposed by glow discharge decomposition to deposit amorphous silicon on a substrate along with the incorporation of a plurality of alterant elements, preferably activated fluorine and hydrogen, during the glow discharge deposition.

In these specific embodiments of the invention disclosed in the latter application, silicon is deposited in a batch mode at a substrate temperature of about 380° C. by the glow discharge of silicon tetrafluoride ($SiF_4$) which supplies the silicon in the deposited amorphous films and fluorine as one altering or compensating element. While silicon tetrafluoride can form a plasma in a glow discharge, it is not by itself most effective as a starting material for glow discharge deposition of silicon. The atmosphere for the glow discharge is made reactive by adding a gas like molecular hydrogen ($H_2$), which is made reactive by the glow discharge by changing it to atomic hydrogen or hydrogen ions or the like. This reactive hydrogen reacts in the glow discharge with the silicon tetrafluoride so as to more readily cause decomposition thereof and to deposit amorphous silicon therefrom on the substrate. At the same time, fluorine and various silicon subfluorides are released and made reactive by the glow discharge. The reactive hydrogen and the reactive fluorine species are incorporated in the amorphous silicon host matrix as it is being deposited and create a new intrinsic material which has a low number of defect states. A simple way to consider the new alloy is that there is a satiation or capping or dangling bonds and the elimination of other defects. Hence, these alterant elements reduce substantially the density of the localized states in the energy gap, with the foregoing beneficial results accruing.

When it is desired to provide n-type and p-type conduction in the amorphous silicon semiconductor matrix, the latter patent recommends incorporation of modifier elements in gaseous form during the glow deposition of the film. The recommended modifier elements or dopants for n-type conduction are phosphorus and arsenic in the form of the gases phosphine ($PH_3$) and arsine ($AsH_3$). The recommended modifier elements or dopants for p-type conduction are boron, aluminum, gallium, and indium, in the form of the gases diborane ($B_2H_6$), $Al(C_2H_5)_3$, $Ga(CH_3)_3$, and $In(CH_3)_3$. The modifier elements were added under the same deposition conditions as described for the intrinsic material with a substrate temperature of about 380° C.

While the process for making deposited silicon devices in the aforesaid applications represents a significant improvement, making possible the production of improved solar cells and other devices, the p-doped deposited silicon material did not have a p-type conductivity as efficient as desired. As reported in the *Journal of Non-Crystalline Solids*, Volumes 35 and 36, Part I, January/February, 1980, pp 171–181, with the addition of 500 ppm $PH_3$ in the deposition gases, corresponding to an n+to layer, no band gap change is evident between the n+ layer and the intrinsic material. With the addition of diborane ($B_2H_6$) in the deposition gases, significant changes in optical absorption takes place. The implication is that a new alloy involving boron has been synthesized which possesses a more narrow band gap and exhibits p-type characteristics. It is possible that three-center bonds unique to boron are responsible in part for this behavior. This is in contrast to the results obtained when phosphorous or arsenic are added where a conventional n-type material is produced.

While devices like a Schottky barrier or MIS device can be made with or without p-doped films, they are difficult to manufacture since the properties of the thin barrier layer commonly used therein are difficult to control and frequently the thin layer cannot be efficiently encapsulated to prevent diffusion of environmental elements therethrough, with the result that the device is frequently unstable. In addition, such structures lead to a high sheet resistance in the upper level of the device. It appears that a photovoltaic cell having desired efficiency and stability requires utilizing a p-n or p-i-n junction. For this purpose, an improved p-doped material is desirable to increase the efficiency of the cell.

In making the fluorine and hydrogen compensated glow discharge deposited silicon films disclosed in the latter aforesaid application, the silicon is preferably deposited at a substrate temperature of about 380° C. Above this substrate temperature, the efficiency of the hydrogen compensation gradually decreases and at temperatures above about 450° C. reduces significantly, because the hydrogen does not readily combine with the depositing silicon at such temperatures.

As noted above, it has been discovered that the introduction of the gaseous p-dopant materials, while producing a p-type material, do not produce a material with a p-type conduction efficiency as would be theorized if only the desired four-sided or tetrahedral bonding were taking place. It appears that at the glow discharge substrate temperatures of 400° C. or below, which are necessary for the most efficient hydrogen compensation of the silicon material, some of the would-be p-dopant materials are threefold rather than tetrahedrally coordinated, because of the absence of crystalline constraints, thus leading to additional states in the gap and no doping. Other processes involving diborane lead to the formation of three-centered bonds, or other less efficient combinations because the metallic or boron parts thereof do not readily disassociate completely from their hydrocarbon or hydrogen companion substitutents and so do not in such form provide an efficient p-doping element in the silicon host matrix. Furthermore, states are added in the band gap of such materials which are believed to reduce the p-doping efficiency achieved.

Therefore, appreciable effort has been made to improve the p-doping efficiency of said p-doping elements in glow discharge deposited silicon material. Glow discharge deposition of silicon for photovoltaic and other applications requiring intrinsic layers or p-n junction formed depletion regions presently appears to be the preferred deposition method therefor, since the degree of hydrogen and fluorine compensation and reduced density of states in the resulting material are superior to that obtained by vapor deposition or sputtering of silicon.

The present invention has to do with a method of more efficiently p-doping material in a glow discharge silicon deposition batch or continuous process to produce more efficiently doped p-type materials and p-n and p-i-n junction devices incorporating the more efficiently p-doped silicon materials. The methods of making p-doped material in the prior art have been limited to use of conventional dopant gases, such as diborane, under the deposition conditions optimized for the intrinsic materials. No one heretofore considered p-dopant gaseous boride compounds (such as $B_2H_6$) and p-dopant metal gaseous compounds useful in glow discharge deposition of amorphous (or polycrystalline) silicon deposited at substrate temperatures above about 450° C., which have been considered to be outside the temperature range required for the preparation of the useful amorphous silicon.

The present invention also encompasses the method of making a more efficiently p-doped glow discharge deposited silicon by depositing the material above about 450° C. The loss of the advantages of hydrogen compensation in the silicon materials deposited at these high temperatures is more than overcome by the increased efficiency by the p-doping achieved, especially where the p-doped deposited layer is to form an ohmic p+ interface with the associated electrode. As previously stated, it appears that at these high temperatures the boron or metal p-dopant elements are so substantially disassociated from the hydrogen and hydrocarbon elements of the gaseous compound used that the three center or other undesirable bonding configurations are eliminated. The desired four-sided (tetrahedral) bonding which is efficient for p-doping is thus obtained. Although p-dopant metal (i.e. Al, Ga, In, Zn, and Tl) compound gases were also not effective as p-type dopants in the glow discharge deposition of silicon using substrate temperatures at or below about 400° C., these elements are good p-dopants in gaseous compound form using the much higher silicon glow discharge substrate temperatures described herein (that is temperatures at least about 450° C.). It should be noted that although the high substrate temperatures above about 450° C. can result in inefficient hydrogen compensation of the silicon material, the material is still effectively fluorine compensated since fluorine efficiently combines with the deposited silicon at substrate temperature up to the range of 700° C. to 800° C.

For amorphous silicon deposited without hydrogen or fluorine compensation, the crystallization process becomes inportant at substrate temperatures of about 550° C. For depositing amorphous silicon with hydrogen compensation and/or alloying, the amorphous state substantially is maintained up to substrate temperatures of about 650° C. For amorphous silicon compensated with hydrogen and doped with boron, the amorphous state remains to substrate temperatures about 700° C. The addition of fluorine such as in the materials of this invention, extends the amorphous state of the deposited material to still higher substrate temperatures. From this it is clear that the present process produces fluorine compensated amorphous silicon doped with boron at substrate temperatures about 700° C. Doping levels achieved with deposition substrate temperatures such that the hydrogen and fluorine compensated silicon films remains substantially amorphous, will be sufficient for certain doping applications. For still higher doping levels, higher deposition substrate temperatures may be used such that the amorphous material will become mixed with crystallites of silicon, or become substantially polycrystalline.

The inclusion of crystallite material into the amorphous deposited silicon or the use of substantially polycrystalline p-doped material does not impair the efficiency of a p-n or p+-i-n+ photovoltaic device. The efficiency is not impaired because the efficiency of p doping in polycrystalline silicon is well known, and because the optical absorption of the crystallites will be lower than that of the amorphous material, so the photon absorption in the photoactive layer will not be affected. For amorphous materials with high absorption coefficients, the p+ layer in a p+-i-n+ structure is kept as thin as possible, less than 1000 angstroms, to minimize absorption of photons since it is a non-photoactive layer. The layer thickness still provides enough positive carriers to bend the conduction and valence bands between the p+ and the intrinsic layer in the device for efficient photovoltaic action. The admixture of silicon crystallites into the amorphous silicon, not only does not impair the efficiency of a p+-i-n+ device, but also may assist the efficiency of a p-n photovoltaic device because of the increased hole mobility and increased photoconductivity of the crystalline p material compared with amorphous p material.

The present invention also discloses the method of eliminating the difficulty of p-doping by utilizing an unconventional non-gaseous material as a dopant. The method includes heating a solid metal to a high temperature to evaporate the metal and then feed the metal vapor directly into the glow discharge chamber with the silicon deposition gases continuously or intermittently. The p-dopant metals in a vaporized metallic form are effective in the glow discharge deposition of silicon at lower substrate temperatures, where fluorine and hydrogen compensation is desired. These evaporated p-dopant metals can also be utilized with glow discharge silicon deposited film at higher substrate temperatures where hydrogen compensation is not needed.

Utilizing the present invention, p-dopant boron and metal materials may be deposited in a continuous process combined with n and intrinsic type glow discharge deposited amorphous materials to manufacture improved p-n and p-i-n junction photovoltaic and the like devices. In the continuous process, the materials are glow discharge deposited upon a web substrate as it is continuously or stepwise moved through separate deposition stations each having the substrate temperature and other environmental conditions necessary to efficiently deposit the particular desired p and n and/or intrinsic type silicon films on the continuous web. In the continuous manufacturing process of the invention, each deposition station is dedicated to depositing one layer (p, i, or n), because the deposition materials contaminate the station background environment and are not easily removed.

While the principles of this invention apply to the aforementioned amorphous and polycrystalline type silicon semiconductor materials, for purposes of illustration herein and as setting forth preferred embodiments of this invention, specific reference is made to gaseous boron and gaseous and evaporated metal p-dopant material glow discharge deposited with the silicon material at substrate temperatures of between 450° C. to 700° C. The deposited film will be fluoride compensated throughout the substrate temperature range, but the hydrogen compensation will decrease with increasing substrate temperature. Also, the evaporated metal p-dopant materials may be glow discharge deposited with the silicon material at substrate temperatures below 400° C. to form a hydrogen and fluoride compensated p-doped material.

In summary, to bring the significance of the present invention into focus, it is believed that the present invention enables the fabrication of more efficient p-type amorphous semiconductor films for use in the manufacture of solar cells and current devices including p-n and p-i-n devices. Additionally, the present invention provides for viable mass production of the various devices in a glow discharge environment with boron or at least one of the metals Al, Ga, In, Zn, or Tl providing the p-dopant material at prescribed substrate temperatures.

The above-described and other advantages and features of the present invention will become more apparent upon making reference to the following additional disclosures, the drawings and the claims.

DESCRIPTION OF EXEMPLARY FORMS OF THE INVENTION

Figure 1:
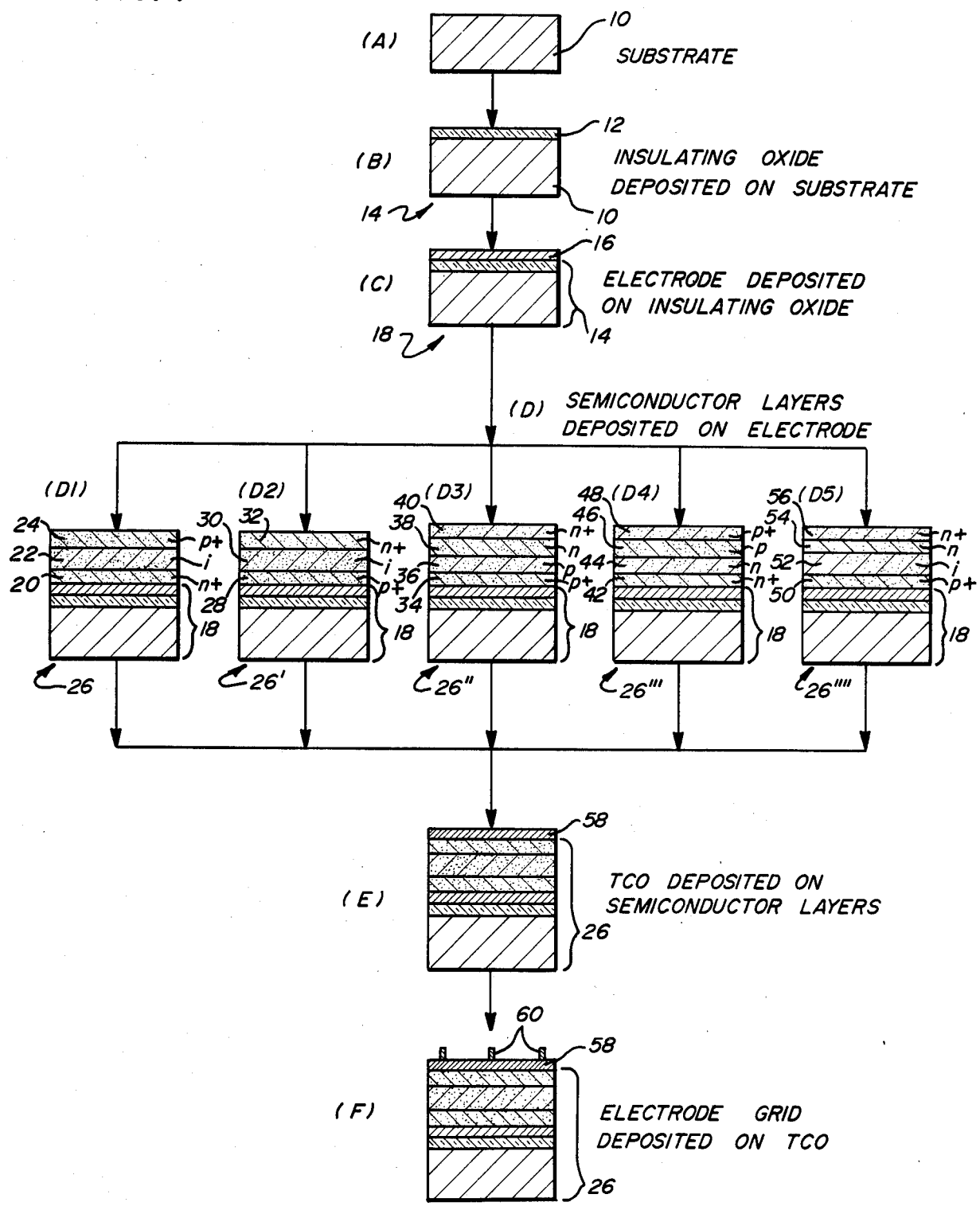
FIG. 1 is a partial schematic and partial diagrammatic illustration of the process steps for making semiconductor devices including the p-doped material of the invention.

Referring to FIG. 1, the first step (A) in the manufacture of the devices incorporating the improved p-type material of the invention includes forming a substrate 10. The substrate may be formed of a non-flexible material such as glass where a batch process is involved or of a flexible web such as aluminum or stainless steel, especially where a continuous mass production process is involved. Thus, the flexible substrate web 10 may be utilized in a continuous process to deposit the various layers of metal electrode-forming and silicon layers as the web is drawn through various deposition stations to be described hereinafter with respect to FIGS. 2 and 3. The aluminum or stainless steel substrate 10 preferably has a thickness of at least about 3 mils, and preferably about 15 mils and is of a width as desired. In the case where the web 10 is a thin, flexible web it is desirably purchased in rolls.

The second step (B) includes depositing an insulating layer 12 on top of the aluminum or stainless steel substrate 10 so that spaced insulated electrode-forming layers are formed, if desired, thereon. The layer 12, for instance about 5 microns thick, can be made of a metal oxide. For an aluminum substrate, it preferably is aluminum oxide ($Al_2O_3$) and for a stainless steel substrate it may be silicon dioxide ($SiO_2$) or other suitable glass. The substrate can be purchased with the insulating layer 12 preformed thereon or the insulating layer 12 can be laid upon the top of the substrate surface 10 in a conventional manufacturing process such as by chemical deposition, vapor deposition, or anodizing in the case of the aluminum substrate. The two layers, substrate 10 and oxide layer 12, form an insulated substrate 14.

The third step (C) includes depositing one or more electrode-forming layers 16 on the insulated substrate 14 to form a base electrode substrate 18 for the junction device to be formed thereon. The metal electrode layer or layers 16 preferably is deposited by vapor deposition, which is a relatively fast deposition process. The electrode layers preferably are reflective metal electrodes of molybdenum, aluminum, chrome, or stainless steel for a photovoltaic device. The reflective electrode is preferable since, in a solar cell, non-absorbed light which passes through the semiconductor material is reflected from the electrode layers 16 where it again passes through the semiconductor material which then absorbs more of the light energy to increase the device efficiency.

The base electrode substrate 18 is then placed in a glow discharge deposition environment, such as the chamber described in said U.S. Pat. No. 4,226,898 or a continuous process apparatus as discussed hereinafter with respect to FIGS. 2 and 3. The specific examples shown in D1–D5 are merely illustrative of the various p-i-n or p-n junction devices which can be manufactured utilizing the improved p-doping methods and materials of the invention. Each of the devices is formed using the base electrode substrate 18. Each of the devices illustrated in D1–D5 has silicon films having an overall thickness of between about 5000 and 30,000 angstroms. This thickness ensures that there are no pin holes or other physical defects in the structure and that there is maximum light absorption efficiency. A thicker material may absorb more light, but at some thickness will not generate more current since the greater thickness allows more recombination of the light generated electron-hole pairs. (It should be understood that the thickness of the various layers shown in D1–D5 are not drawn to scale.)

Referring first to D1, an n-i-p device is formed by first depositing a heavily doped $n^+$ silicon layer 20 on the substrate 18. Once the $n^+$ layer 20 is deposited an intrinsic (i) silicon layer 22 is deposited thereon. The intrinsic layer 22 is followed by a highly doped conductive $p^+$ silicon layer 24 deposited as the final semiconductor layer. The silicon layers 20, 22, and 24 form the active layers of an n-i-p device 26.

While each of the devices illustrated in D1–D5 may have other utilities, they will be now described as photovoltaic devics. Utilized as a photovoltaic device, the selected outer, $p^+$ layer 24 is a low light absorption, high conductivity layer. The intrinsic layer 22 is a high absorption, low conductivity, and high photoconductivity layer over a low light absorption, high conductivity $n^+$ layer 20. The overall device thickness between the inner surface of the electrode layer 16 and the top surface of the $p^+$ layer 24 is, as stated previously, on the order of at least about 5000 angstroms. The thickness of the $n^+$ doped layer 20 is preferably in the range of about 50 to 500 angstroms. The thickness of the amorphous intrinsic layer 22 is preferably between about 5000 angstroms to 30,000 angstroms. The thickness of the top $p^+$ contact layer 24 also is preferably between about 50 to 500 angstroms. Due to the shorter diffusion length of the holes, the $p^+$ layer generally will be as thin as possible on the order of 50 to 150 angstroms. Further, the outer layer (here $p^+$ layer 24) whether $n^+$ or $p^+$ will be kept as thin as possible to avoid absorption of light in that contact layer.

Each of the layers can be deposited upon the base electrode substrate 18 by a conventional glow discharge chamber described in the aforesaid U.S. Pat. No. 4,226,898 or preferably in a continuous process described hereinafter with respect to FIGS. 2 and 3. In either case, the glow discharge system initially is evacuated to approximately 20 mTorr to purge or eliminate impurities in the atmosphere from the deposition system. The silicon material preferably is then fed into the deposition chamber in a compound gaseous form, most advantageously as silicon tetrafluoride ($SiF_4$). The glow discharge plasma preferably is obtained from a silicon tetrafluoride and hydrogen ($H_2$) gas mixture, with a preferred ratio range of from about 4:1 to 10:1. Preferably, the deposition system is operated at a pressure in the range of about 0.3 to 1.5 Torr, preferably between 0.6 to 1.0 Torr such as about 0.6 Torr.

The semiconductor material is deposited from a self-sustained plasma onto the substrate which is heated, preferably by infrared means to the desired deposition temperature for each layer. The p-doped layers of the devices are deposited at specific temperatures, depending upon the form of the p-doping material used. The evaporated p-dopant metal vapors can be deposited at the lower temperatures, at or below about 400° C., where a well compensated silicon material is desired, but it can be deposited at higher temperatures up to about 1000° C. The upper limitation on the substrate temperature in part is due to the type of metal substrate 10 utilized. For aluminum the upper temperature should not be above about 600° C. and for stainless steel it could be above about 1000° C. If a well compensated amorphous silicon layer is to be produced, which is necessary to form the intrinsic layer in a n-i-p or p-i-n device, the substrate temperature should be less than about 400° C. and preferably about 300° C.

To deposit an amorphous p-doped hydrogen compensated silicon material utilizing the evaporated metal vapors of the invention, the substrate temperature is in the range of about 200° C. to 400° C., preferably in the range of about 250° C. to 350° C., and desirably about 300° C.

To deposit the silicon semiconductor material utilizing the p-dopant gases of the invention, the substrate temperature is in the range of about 450° C. to 800° C., preferably in the range of about 500° C. to 700° C.

The doping concentrations are varied to produce the desired p, $p^+$, n, or $n^+$ type conductivity as the layers are deposited for each device. For n or p doped layers, the material is doped with 5 to 100 ppm of dopant material as it is deposited. For $n^+$ or $p^+$ doped layers the material is doped with 100 ppm to over 1 percent of dopant material as it is deposited. The n dopant material can be phosphine or arsine in the above amounts. The p dopant material can be those of the invention deposited at the respective substrate temperatures, preferably in the range of 100 ppm to over 5000 ppm for the $p^+$ material.

The glow discharge deposition process includes an a.c. signal generated plasma into which the materials are introduced. The plasma preferably is sustained between a cathode and substrate anode with an a.c. signal of about 1 kHz to 13.6 MHz.

Although the p-doping method and materials of the invention can be utilized in devices with various silicon amorphous semiconductor material layers it is preferable that they are utilized with the fluorine and hydrogen compensated glow discharge deposited materials disclosed in said U.S. Pat. No. 4,226,898. In this case, a mixture of silicon tetrafluoride and hydrogen is deposited as an amorphous silicon compensated material at or below about 400° C., for the intrinsic and n-type layers. In the examples shown in D2, D3, and D5, the p+ layer which is placed upon the electrode layer 16 can be deposited at a higher substrate temperature above about 450° C. which will provide a material which is fluorine compensated. The material will then not be efficiently hydrogen compensated since the hydrogen does not efficiently deposit with the silicon at the higher substrate temperature ranges, and will be swept away with the exhaust gases.

The devices illustrated in D1 and D4, where the p+ layers are on the outer side of the intrinsic "i" layer, may not have high temperature deposited p+ layers, since substrate deposition temperatures above about 450° C. would destroy the hydrogen compensation underlying character of the layers, the intrinsic "i" layer being one which may be a well hydrogen and fluorine compensated amorphous layer in a photovoltaic device. The n and n+ type layers in each of the devices are also preferably deposited in amorphous fluorine and hydrogen compensated form. The conventional n dopant materials are readily deposited with the silicon material at the lower temperatures below about 400° C. and result in high doping efficiency. Thus, in D1 and D4, in these structures each of the layers is amorphous silicon and, the p+ layer is best formed with one of the evaporated p-dopant metal vapors at a substrate temperature of at or less than about 400° C. Using gaseous metal or boron compound p-dopant materials requiring high substrate temperatures is also useful, provided the temperature does not reach a value which destroys the characteristics of the underlying amorphous layers.

The second device 26' illustated in D2 has the opposite configuration from the D1 p-i-n device. In the device 26' a p+ layer 28 is first deposited on the base electrode substrate 18, followed by an intrinsic layer 30 and an outer n+ layer 32. In this device, the p+ layer can be deposited at any substrate temperature in the range of the invention.

The devices 26" and 26'" illustrated in D3 and D4 also are of opposite configuration, being respectively p-n and n-p junction devices. In the device 26", a p+ amorphous silicon layer 34 is deposited on the base electrode substrate 18, followed by an amorphous silicon p layer 36, then an amorphous silicon n layer 38, and finally an amorphous silicon n+ outer layer 40. In the device 26'" the inverse order is followed with an n+ amorphous silicon layer 42 deposited first followed by an n layer 44, a p amorphous silicon layer 46, and finally an outer p+ amorphous silicon layer 48.

A second type of p-i-n junction device 26"" is illustrated in D5. In this device a p+ amorphous layer 50 is deposited, followed by an intrinsic amorphous silicon layer 52, an n type amorphous silicon layer 54 and an outer n+ amorphous silicon layer 56. (The inverse of this structure, not illustrated, also can be utilized).

Following the glow discharge of the various semiconductor layers in the desired order, a fifth step (E) is performed preferably in a separate deposition environment. Desirably, a vapor deposition environment is utilized since it is a faster deposition process than the glow discharge process. In this step, a TCO layer 58 (transparent conductive oxide) is added, for example to device 26, which may be indium tin oxide (ITO), cadmium stannate ($Cd_2SnO_4$), or doped tin oxide ($SnO_2$).

Following the TCO layer 58, an optional step six (F) can be performed to provide an electrode grid 60. The grid 60 can be placed upon the top of the TCO layer 58 depending upon the final size of the devices utilized. In a device 26 having an area of less than 2 square inches or so, the TCO is sufficiently conductive such that an electrode grid is not necessary for good efficiency. If the device has a greater area or if the conductivity of the TCO layer is such that it is desired, the electrode grid 60 can be placed upon the TCO layer to shorten the carrier path and increase the conduction efficiency of the devices.

Figure 2:
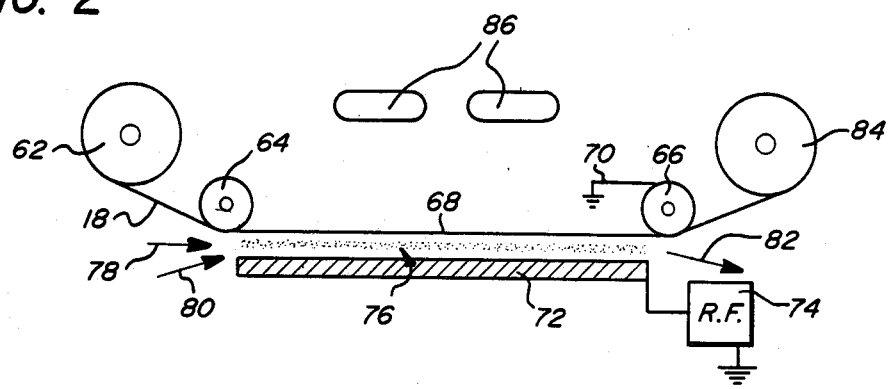
FIG. 2 is a diagrammatic illustration of an apparatus for continuously depositing the semiconductor films of the invention.

As discussed above, the devices 26 to 26"" can be formed as described in a conventional glow discharge chamber, but preferably are formed in a continuous process as generally illustrated in FIG. 2.

In FIG. 2 a diagrammatic illustration of the continuous processing wherein one deposition area is illustrated. The base electrode substrate 18 is unwound from a payout reel 62 around a pair of rollers 64 and 66 forming a planar deposition area 68 therebetween. The substrate 18 is in electrical contact with the roller 66 which is coupled to ground by a lead 70. The substrate in the planar area 68 forms an anode adjustably spaced from a cathode plate 72. The cathode is coupled to the output terminal of an r.f. source 74. The area between the anode area 68 and the cathode 72 forms a plasma glow discharge deposition region 76.

Although not illustrated, each of the elements in FIG. 2 is enclosed within an evacuated space to isolate the glow discharge region 76 from the surrounding environment. The deposition gases are introduced into the plasma region 76 as illustrated by an arrow 78. The dopant material can be introduced in a second flow stream as illustrated by an arrow 80 or the dopant input can be combined with the deposition gases. The exhausted gases are removed from the plasma region 76 and the system as indicated by an arrow 82.

The deposition area of FIG. 2 can be utilized in a batch mode by introducing the proper mix of gases to form each desired layer in succession. In a continuous process, only one type of material can be deposited in a single pass of the substrate 18 through the plasma area from the payout reel 62 to a takeup reel 84; however, the operation of the reels can be reversed at the end of the web 18 and a second and succeeding layers can be deposited in successive passes through the plasma regions 76 with the introduction of the desired dopant material in each pass. The temperature of the substrate 18 can be controlled by one or more infrared heat lamps or other sources 86. The glow discharge deposition may occur at a fairly slow rate of 2 to 5 angstroms of material thickness deposited per second. Assuming the deposition of the semiconductor material 5000 angstroms thick on the substrate 18, the 5000 angstrom layer at 5 angstroms per second would take about 1000 seconds to complete. This is, of course, feasible but it is preferable to deposit the layers on the substrate 18 in a number of deposition stations to increase the deposition rate, as illustrated in FIG. 3.

Figure 3:
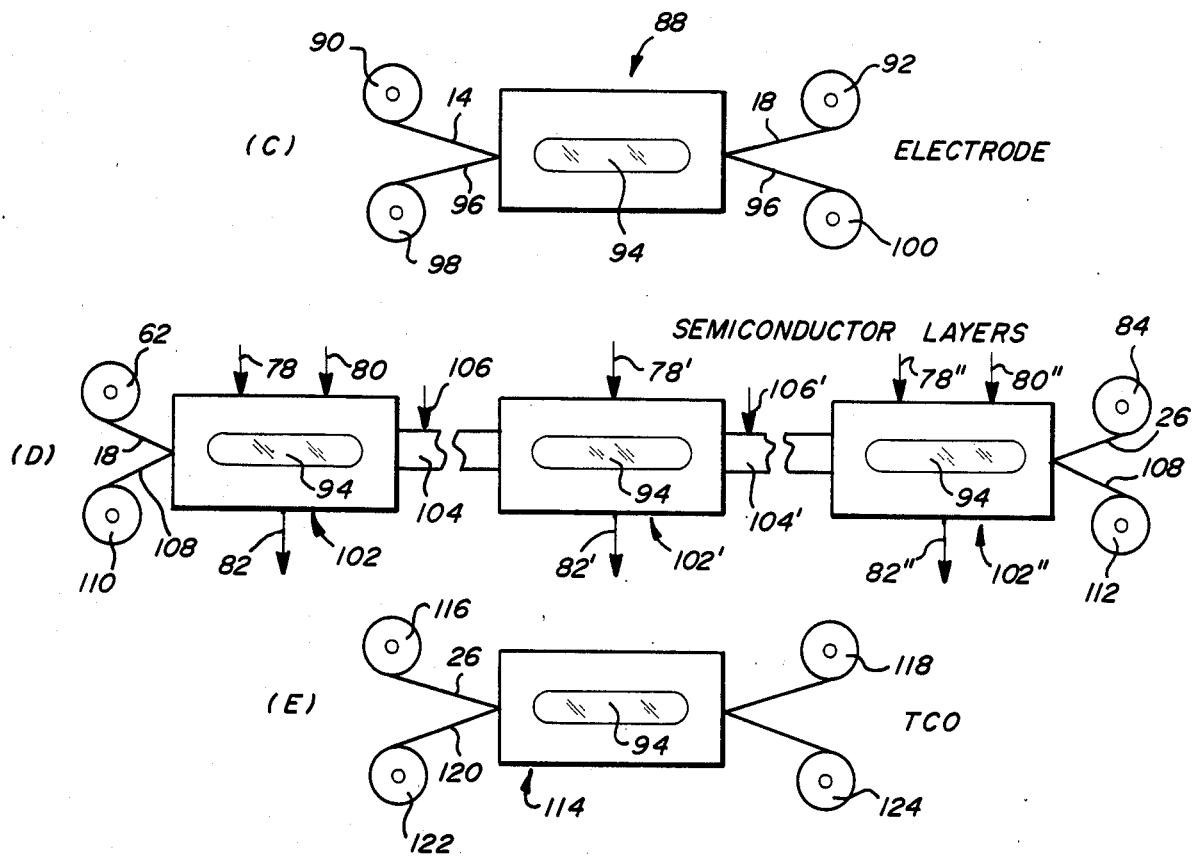
FIG. 3 is a block diagram of one illustrative apparatus for performing the process steps of FIG. 1 to continuously form the improved p-doped semiconductor devices of the invention.

Referring to FIG. 3, an overall system block diagram is illustrated to perform the processes of the steps C, D, and E of FIG. 1. Step C can be performed in a vapor deposition chamber 88. The oxidized substrate 14 is fed off a payout reel 90 into and through the chamber 88 where the electrode layer is deposited thereon to form the base electrode substrate 18 and then to a takeup reel 92. The deposition process may be observed through a viewing port 94 visually or by monitoring and control instrumentation.

The electrode layer can be formed with a grid pattern by a mask 96 in the form of a web similar to the substrate 14. The mask 96 is fed off the payout reel 98 into registry with the substrate 14 as it passes through the chamber 88 and then to a takeup reel 100.

Following the deposition of the electrode layer, the base electrode substrate 18 is fed successively into and through a plurality of glow discharge chambers 102, 102', and 102", each including a plasma area like 76 and the other glow discharge elements illustrated in FIG. 2. The same numerals have been utilized in each Fig. to identify identical or substantially identical elements. It also is feasible that all of the chamber deposition areas 76 be enclosed in a single chamber isolated one from another.

The n-i-p device 26 of D1 will be utilized to describe the following specific continuous deposition example. In this case, the base electrode substrate 18 is fed off the payout reel 62 into the chamber 102. The deposition gas, such as premixed silicon tetrafluoride and hydrogen, is fed into the deposition region 76 as indicated by the arrow 78. The dopant material, such as phosphine, is fed into the deposition region 76 as indicated by the arrow 80. The exhausted gases are removed from the chamber as indicated by arrow 82.

Depending on the deposition speed desired and the thickness of the n+ layer 20 to be deposited, there can be one or more chambers 102 each depositing the n+ doped layer 20. Each of the chambers 102 is connected by an isolation passageway 104. The exhaust 82 from each chamber 102 should be sufficient to isolate each of the chambers; however, an inert carrier gas can be bled into each passageway 104 as indicated by an arrow 106 to sweep the passageway 104 clear of any gases from the chamber on either side of the passageway. The doping concentrations can be varied in each of the successive chambers to grade the layers if desired.

The chamber 102' is only fed the premixed deposition gases silicon tetrafluoride and hydrogen shown by the arrow 78' in this example, since it deposits the intrinsic layer 22 without any dopant material being introduced. Again, there can be a plurality of chambers 102' to increase the deposition speed of the layer 22. Further, since each of the chambers 102, 102' etc. is depositing on the same continuous web the number of deposition areas 76 for each layer and the sizes thereof are matched to deposit the desired layer thicknesses for each type of layer for the device to be formed, here n-i-p device 26.

The substrate 18 is then fed into the chamber 102" which is fed the deposition gases as indicated by the arrow 78". The p-dopant material is fed into the deposition area as indicated by the arrow 80". In this example, the p-dopant is the evaporated metal vapor since the p+ layer 24 is being applied over the amorphous n+ and i layers. Again, there can be one or more chambers 102" and the film 26 from the final chamber 102" is taken up on the takeup reel 84.

A mask 108 compatible with the electrode mask 96 can be fed off a payout reel 110 and passed through the successive chambers 102 in registry with the substrate 18. The mask 108 is taken up on a takeup reel 112 following the last chamber 102".

The device film 26 then is fed into a vapor deposition chamber 114 to deposit the TCO layer 58 of step E. The film 26 is fed off a dopant reel 116 through the chamber 114 to a takeup reel 118. A suitable mask 120 can be fed from a payout reel 122 to a makeup reel 124. If the electrode grid 60 is desired, it can be applied in a similar vapor deposition chamber with a suitable mask (not illustrated).

For manufacturing a particular device such as the p-i-n device 26', each of the chambers 102, 102', and 102" is dedicated to depositing a particular film layer. As stated above each of the chambers is dedicated to depositing one layer (p, i, or n) since the deposition materials for other layers contaminate the chamber background environment. To optimize each layer of the p-n or p-i-n device, it is critical that dopants from the other types of layers are not present since they will interfere with the preferable electrical characteristics of the layer. For example, depositing a p or n layer first, contamination of the following intrinsic layer by the residual p or n dopant creates localized states in the intrinsic layer. The efficiency of the device thus will be reduced by the contamination. The problem of contamination which causes the lower efficiency of the devices has been encountered when a specific deposition chamber was used for making successive layers of p-n or p-i-n devices. The contamination of the chamber environment is not easily removed so that it presently is not feasible to utilize a single chamber for more than one layer in a continuous process, since other layers are contaminated by the residual materials remaining in the background environment.

While, for purposes of illustration, several forms of this invention have been disclosed, other forms thereof will become apparent to those skilled in the art upon reference to this disclosure and, therefore, this invention is to be limited only by the scope of the appended claims.

We claim:

1. A method of making a thin film silicon alloy photovoltaic panel comprising the steps of:
   providing a substantially continuous web of flexible substrate material, said substrate material comprising a support layer having at least one substantially planar deposition surface with a layer of electrically insulating material thereupon;
   providing one or more electrode-forming regions upon the layer of insulating material;
   providing at least three discrete deposition chambers, each chamber including glow discharge means for the deposition of a discrete layer of thin film silicon alloy material; the conductivity type of the layer of silicon alloy material deposited in each chamber differing from one another;
   substantially continuously feeding said web of substrate material through each of the deposition chambers;
   introducing a plurality of reaction gases into each of the deposition chambers;

providing means between adjacent deposition chambers for isolating the reaction gases in each chamber from one another;

activating the glow discharge deposition means for disassociating said reaction gases and depositing a successive layer of silicon alloy material in each of the deposition chambers, said layers of silicon alloy material forming a photovoltaic region; and forming a thin, flexible electrode layer on said last deposited layer of silicon alloy material.

* * * * *